United States Patent
Sinha et al.

(10) Patent No.: US 7,496,883 B2
(45) Date of Patent: Feb. 24, 2009

(54) METHOD AND APPARATUS FOR IDENTIFYING AND CORRECTING PHASE CONFLICTS

(75) Inventors: Subarnarekha Sinha, Foster City, CA (US); Charles C. Chiang, San Jose, CA (US)

(73) Assignee: Synopsys, Inc., Mountain View, CA (US)

( * ) Notice: Subject to any disclaimer, the term of this patent is extended or adjusted under 35 U.S.C. 154(b) by 631 days.

(21) Appl. No.: 11/127,694

(22) Filed: May 11, 2005

(65) Prior Publication Data

US 2006/0199083 A1    Sep. 7, 2006

Related U.S. Application Data

(60) Provisional application No. 60/659,581, filed on Mar. 7, 2005.

(51) Int. Cl.
*G06F 17/50* (2006.01)

(52) U.S. Cl. .............................. 716/21; 716/19; 716/20; 430/5; 430/30

(58) Field of Classification Search ............. 716/19–21; 430/5.3
See application file for complete search history.

(56) References Cited

U.S. PATENT DOCUMENTS

| | | | |
|---|---|---|---|
| 6,698,007 B2 * | 2/2004 | Wu et al. | 716/19 |
| 6,832,364 B2 * | 12/2004 | Heng et al. | 716/21 |
| 7,216,331 B2 * | 5/2007 | Wu et al. | 716/21 |
| 2002/0083410 A1 * | 6/2002 | Wu et al. | 716/19 |

* cited by examiner

*Primary Examiner*—Thuan Do
*Assistant Examiner*—Nghia M Doan
(74) *Attorney, Agent, or Firm*—Park, Vaughan & Fleming LLP

(57) ABSTRACT

One embodiment of the present invention provides a system that identifies a substantially minimal set of phase conflicts in a PSM-layout that when corrected renders the layout phase-assignable. During operation, the system constructs a phase-conflict graph from a PSM-layout such that the PSM-layout is phase-assignable if and only if the phase-conflict graph is bipartite. Next, the system removes a first set of edges from the phase-conflict graph to make the graph planar, and then removes a second set of edges to make the graph bipartite. The system then adds zero or more edges of the first set of edges, and determines a set of phase conflicts in the PSM-layout based on the remaining edges in the first set of edges and the second set of edges. The system can also be used to correct a given set of phase conflicts in a PSM-layout.

7 Claims, 7 Drawing Sheets

METHOD AND APPARATUS FOR IDENTIFYING AND CORRECTING PHASE CONFLICTS

RELATED APPLICATIONS

This application hereby claims priority under 35 U.S.C. §119 to U.S. Provisional Patent Application No. 60/659,581, filed on Mar. 7, 2005, entitled "Method and apparatus for identifying and correcting phase conflicts," by inventors Subarnarekha Sinha and Charles C. Chiang

BACKGROUND

1. Field of the Invention

The present invention relates to the process of designing and fabricating semiconductor chips. More specifically, the present invention relates to a method and an apparatus for identifying and correcting phase conflicts in a phase shift mask or layout.

2. Related Art

The relentless miniaturization of integrated circuits has been a key driving force behind technological innovation. This miniaturization has been made possible by significant improvements in various fabrication technologies.

Phase shift mask (PSM) technology is one such improvement. In PSM technology, phase shifters are inserted around certain mask/layout features, which enable a semiconductor manufacturing process to achieve line widths that are smaller than the wavelength of the light used to expose a photoresist layer through the mask. Typically, features that are smaller than a certain threshold width are difficult to print and need to have phase shifters around them. Such features are usually called critical features.

Specifically, a critical feature in the mask/layout is flanked by two phase shifters that have opposing phases (e.g., 180° apart). These phase shifters typically have a minimum width specification. In addition, shifters that are separated by less than a certain distance, d, need to be assigned the same phase. If two shifters are closer than d, they will be referred to as overlapping shifters. These constraints give rise to the phase assignment problem, which can be stated as follows: given a layout, construct a new layout that has shifters built around critical features (henceforth, referred to as a PSM-layout) and assign phases to the shifters in such a way that they satisfy the above constraints. (Note that, a PSM-layout is called phase-assignable if and only if there exists a correct solution for the phase assignment problem.)

It is hard to capture these constraints with traditional design rules used in layout generation like minimum width and spacing rules. Hence, it is highly likely that there will be a layout that satisfies all the design rules, and yet it is impossible to solve the phase assignment problem on its corresponding PSM-layout due to conflicting constraints. In other words, the PSM-layout is not phase-assignable. Adjacent phase shifters that belong to a cyclic sequence of phase dependencies that cannot be mapped according to the rules mentioned earlier are said to be in phase conflict. A layout that has phase conflicts cannot use PSM technology for imaging. This can adversely affect the printability of the layout and hence the final yield.

As semiconductor processes move towards deep submicron dimensions, an increasing number of features will be deemed critical and will need PSM technology for imaging. This would result in an increase both in the number and in the complexity of phase conflicts in PSM-layouts.

Hence, it is of utmost importance to develop a systematic and efficient methodology for identifying and correcting phase conflicts in a layout.

SUMMARY

One embodiment of the present invention provides a system that identifies a set of phase conflicts in a layout that when corrected will render the layout phase-assignable. During operation, the system constructs a phase-conflict graph from a PSM-layout such that the PSM-layout is phase-assignable if and only if the phase-conflict graph is bipartite. (Note that the instant application describes systems and techniques in the context of a PSM-layout. But, it will be apparent that these systems and techniques can easily be applied to a PSM-mask.) The system then removes a first set of edges from the phase-conflict graph to create a planar sub-graph. Next, the system removes a second set of edges from the planar sub-graph to create a bipartite sub-graph, wherein each edge in the second set of edges is associated with a phase conflict in the PSM-layout. The system then adds zero or more edges of the first set of edges to the bipartite sub-graph, such that none of the added edges creates an odd cycle in the bipartite sub-graph. Next, the system determines a set of phase conflicts in the PSM-layout associated with the remaining edges in the first set of edges and the second set of edges. Note that, first making the phase-conflict graph planar and then making it bipartite allows the method to determine a substantially minimal set of phase conflicts, which reduces the number of corrections required to make the PSM-layout phase-assignable.

In a variation on this embodiment, the system constructs the phase-conflict graph from the PSM-layout by: creating a node in the phase-conflict graph for a shifter in the PSM-layout; creating a conflict-edge between a pair of nodes associated with a pair of adjacent shifters that need to have different phase shifts; creating an edge between a pair of nodes associated with a pair of overlapping shifters that need to have the same phase shift; and creating an overlap-node that subdivides the edge into two overlap-edges, such that the first overlap-edge is between one node of the edge and the overlap-node and the second overlap-edge is between the other node of the edge and the overlap-node.

In a variation on this embodiment, an overlap-edge can be assigned a weight $a \cdot W + b \cdot (1/F)$, where W is the minimum amount of space that needs to be added between the pair of overlapping shifters associated with the overlap-edge so that they can have different phase shifts, F is the number of phase conflicts that are corrected when space is added between the pair of overlapping shifters, and a, b are weighting factors. Moreover, a conflict-edge can be assigned a substantially higher weight than an overlap-edge, thereby ensuring that the first set of edges and the second set of edges primarily contain overlap-edges. Additionally, removing the second set of edges from the planar sub-graph involves identifying a minimum-weight set of edges that when removed make the planar sub-graph bipartite. Finally, adding zero or more edges of the first set of edges involves restoring higher weighted edges before restoring lower weighted edges.

In a variation on this embodiment, the phase conflicts can be identified at the mask synthesis stage, rather than the layout generation stage.

In a variation on this embodiment, the phase shift of a shifter can be 0°, 90°, 180°, 270°, or any other combination of phase shifts that offsets the phase shifts of adjacent shifters by 180°.

One embodiment of the present invention provides a system that can correct phase conflicts in a PSM-layout to make the PSM-layout phase-assignable. During operation, the system receives a set of phase conflicts associated with overlapping shifters that need to have different phase shifts to make the PSM-layout phase-assignable. The system then determines a substantially minimal set of lines in the layout, wherein adding space along the substantially minimal set of lines moves the overlapping shifters away from one another, which allows them to have different phase shifts, and hence, corrects the set of phase conflicts. The set of lines is substantially minimal because it is not possible to remove any line from the set without leaving some phase conflicts uncorrected in the PSM-layout. Note that moving the overlapping shifters away from one another by adding space along the substantially minimal set of lines reduces the amount of changes to the layout, thereby reducing or preventing timing and integrity problems. Moreover, the present system of layout modification can prevent introducing any additional design-rule-check (DRC) errors, which can obviate the need for a subsequent physical verification stage.

In a variation on this embodiment, the system determines the substantially minimal set of lines in the layout by: identifying a set of lines in the layout, such that adding space along a line in the set of lines corrects one or more phase conflicts; assigning a weight to each line in the set of lines, which indicates the cost of adding space along the line; and identifying a minimum-weight subset of the set of lines, wherein adding space along the lines in the subset corrects the set of selected phase conflicts.

In a variation on this embodiment, a phase conflict in the set of phase conflicts can be associated with an overlap-edge of a phase-conflict graph. Furthermore, each shifter in the PSM-layout can be associated with a node of the phase-conflict graph. Additionally, each pair of adjacent shifters in the PSM-layout that need to have different phase shifts can be associated with a conflict-edge of the phase-conflict graph. Moreover, each pair of overlapping shifters in the PSM-layout that needs to have the same phase shift can be associated with an overlap-node and a pair of overlap-edges of the phase-conflict graph.

In a variation on this embodiment, a line in the substantially minimal set of lines can pass through a feature in the PSM-layout. Note that adding space along the line increases the width of the feature.

In a variation on this embodiment, the system can be used in combination with other techniques for correcting phase conflicts in the PSM-layout.

DETAILED DESCRIPTION

Integrated Circuit Design and Fabrication

Figure 1:
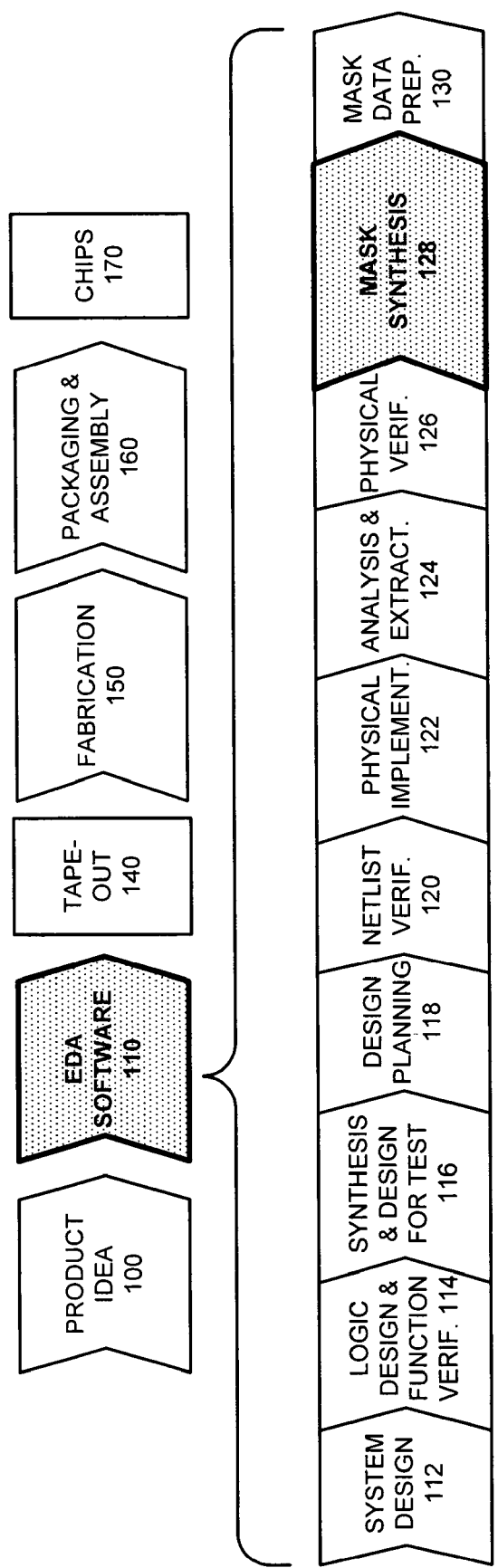
FIG. 1 illustrates various steps in the design and fabrication of an integrated circuit in accordance with an embodiment of the present invention.

FIG. 1 illustrates various steps in the design and fabrication of an integrated circuit in accordance with an embodiment of the present invention. The process starts with a product idea (step 100). Next, the product idea is realized using an integrated circuit, which is designed using Electronic Design Automation (EDA) software (step 110). Once the circuit design is finalized, it is taped-out (step 140). After tape-out, the process goes through fabrication (step 150), packaging, and assembly (step 160). The process eventually culminates with the production of chips (step 170).

The EDA software design step 110, in turn, includes a number of sub-steps, namely, system design (step 112), logic design and function verification (step 114), synthesis and design for test (step 116), design planning (step 118), netlist verification (step 120), physical implementation (step 122), analysis and extraction (step 124), physical verification (step 126), mask synthesis (step 128), and mask data preparation (step 130).

Note that, identification and correction of phase conflicts can take place during the physical implementation step 122, the physical verification step 126 or the mask synthesis step 128. Specifically, identifying and correcting phase conflicts can be implemented by suitably modifying Cadabra®, FullPhase® or Hercules@ products from Synopsys, Inc.

Phase Shift Mask (PSM)

The relentless miniaturization of integrated circuits has been a key driving force behind technological innovations. This miniaturization has been made possible by rapid improvements in various fabrication technologies.

Phase shift mask (PSM) technology is one such improvement. PSM is a powerful resolution enhancement technique that can substantially increase the resolution of a conventional optical lithography system. Specifically, a mask printed using PSM technology contains phase shifters that introduce phase shifts (typically 180°) between light waves traveling through adjacent openings around critical features. This enhances the resolution limit of the lithography equipment and enables the fabrication process to achieve line widths that are smaller than the wavelength of the light used to expose the photoresist layer through the mask.

Note that there are different types of PSMs. For the sake of clarity, we describe embodiments of the present invention in the context of an alternating aperture PSM (AAPSM). But, these embodiments can easily be extended to include other types of PSMs. In the remainder of the instant application, unless otherwise stated, the term "PSM" will refer to an alternating aperture PSM. Furthermore, although these embodiments are described in the context of a clear (or bright) field PSM, they can be readily extended to include the dark field case.

Figure 2:
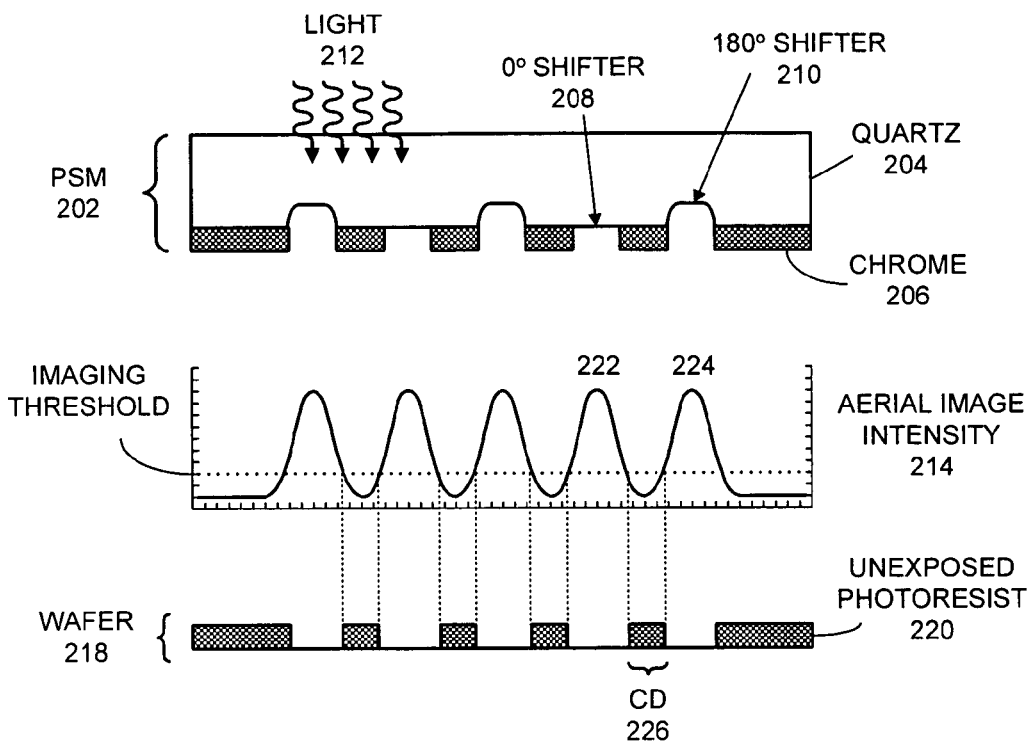
FIG. 2 illustrates how PSM technology can be used to produce features on a wafer in accordance with an embodiment of the present invention.

FIG. 2 illustrates how PSM can be used to produce features on a wafer in accordance with an embodiment of the present invention. (Note that the drawings in FIG. 2 are for illustration purposes only, and do not depict an actual lithography process.)

In one embodiment of the present invention, PSM 202 comprises a clear medium, such as quartz plate 204, with deposits of an opaque substance, such as chrome 206. Moreover, adjacent clear areas, called "shifters", on PSM 202 have different phase shifts. For example, in one embodiment of the present invention, shifter 208 has a phase shift of 0°, while adjacent shifter 210 has a phase shift of 180°. It will be apparent to one skilled in the art that a number of different phase shifts can be used in a PSM. For example, in another embodiment of the present invention, adjacent shifters have phase shifts of 90° and 270°, or any other combination of phase shifts that offsets the phase shifts of adjacent shifters by 180°.

During operation, light 212 is passed through the PSM 202 to create an aerial image on the wafer 218. Plot 214 illustrates the variation of the aerial image intensity on the wafer's surface. Note that the aerial image intensity 214 contains a number of destructive interference nodes that are caused by two adjacent shifters, such as shifters 208 and 210, on PSM 202. These destructive interference nodes are used to create unexposed areas on the resist layer on the wafer 218. After the resist layer is etched away, these unexposed areas, such as unexposed resist 220, form the desired pattern on the wafer's surface.

Phase Conflicts in PSM-layouts

A phase shift mask works by exploiting the fact that light passing through a mask's clear regions exhibits a wave characteristic having a phase that is a function of the distance the light travels through the mask material. Specifically, a critical feature (which is a feature that is smaller than a certain threshold width) in the PSM-layout is flanked by two phase shifters, that have opposing phases (e.g., 180° apart). The phase difference causes destructive interference in the region between adjacent openings (which is actually the critical feature being printed) and enables clear imaging of the critical feature. Moreover, overlapping shifters (i.e. shifters that are separated by less than a certain distance d) must have the same phase. Additionally, phase shifters also need to satisfy design-rule constraints. These constraints gives rise to the phase assignment problem, which can be stated as follows: given a layout, construct a PSM-layout (i.e. a layout that has shifters inserted around critical features so that PSM can be used for imaging them) from it and assign phases to the shifters in such a way that the above mentioned constraints are satisfied.

Note that, in some situations, it may be impossible to assign phases to the shifters due to conflicting constraints. These situations are called phase conflicts. More specifically, a phase conflict refers to a pair of phase shifters that belong to a cyclic sequence of phase dependencies that cannot be mapped according to the requirements mentioned above. A PSM-layout that has phase conflicts cannot successfully use PSM technology for imaging.

Unfortunately, as semiconductor processes move towards (and beyond) deep submicron dimensions, phase conflicts are expected to increase both in number and in complexity due to the fact that an increasing number of features in the layout will need to use PSM for accurate imaging.

Figure 3:
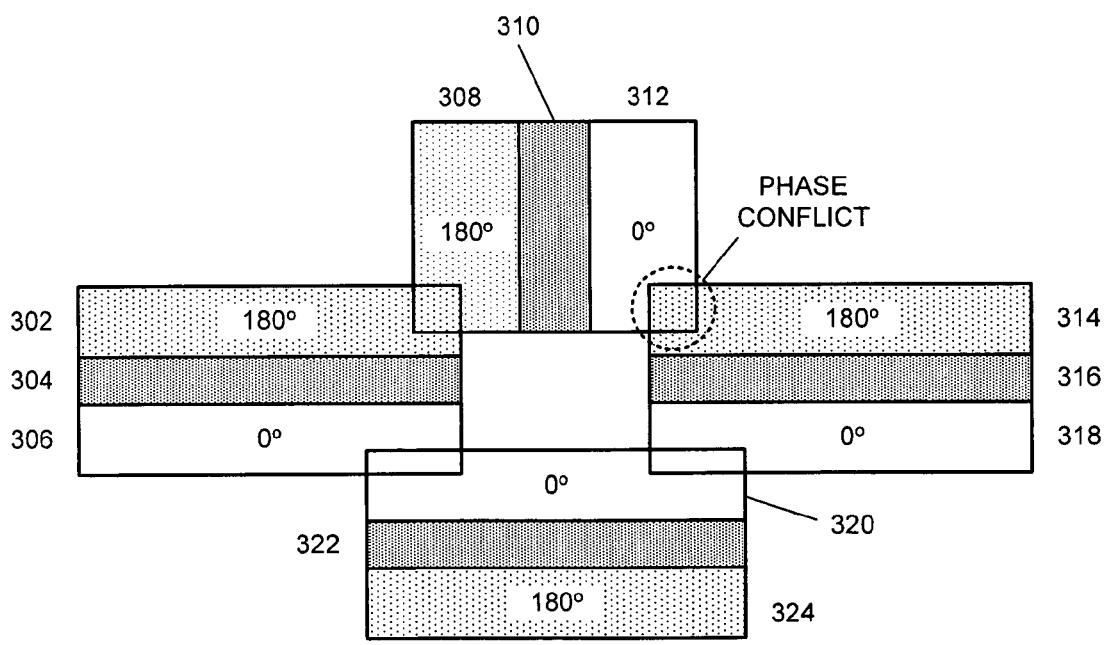
FIG. 3 illustrates a phase conflict in a PSM in accordance with an embodiment of the present invention.

FIG. 3 illustrates a phase conflict in a PSM-layout in accordance with an embodiment of the present invention.

Feature 304 is flanked by 180° phase shifter 302 and 0° phase shifter 306. Likewise, feature 310 is flanked by 180° shifter 308 and 0° shifter 312, feature 316 is flanked by 180° shifter 314 and 0° shifter 318, and feature 322 is flanked by 0° shifter 320 and 180° shifter 324. Furthermore, note that 180° shifter 302 overlaps with 180° shifter 308. Similarly, 0° shifter 320 overlaps with two 0° shifters, namely, 306 and 318.

Furthermore, note that, the overlap between 0° shifter 312 and 180° shifter 314 gives rise to a situation that where the phase assignment problem cannot be solved for the given layout. In fact, the PSM-layout shown in FIG. 3 is not phase-assignable. For example, changing the phase shift of shifter 312 to 180° does not solve the problem because, then, shifters 308 and 312 would have the same phase shift, instead of having opposite phase shifts. Hence, each of the adjacent shifter pairs—{(302, 306), (306, 322), (322, 318), (318, 314), (314, 312)}—are in phase conflict.

Note that design rule checks (DRCs) can be used to avoid extremely simple types of phase conflicts that arise only due to phase dependencies between phase shifters of a pair of neighboring features, but DRCs cannot avoid or detect phase conflicts that occur due to phase dependency constraints between multiple features, like the dependence between layout features 304, 310, 316 and 322 in FIG. 3.

One embodiment of the present invention can identify a set of phase conflicts in a PSM-layout. Specifically, the embodiment can determine a substantially minimal set of phase conflicts that when corrected makes the PSM-layout phase-assignable.

One embodiment of the present invention can correct a set of selected phase conflicts in a layout, such that the modified layout does not have any DRC errors and its corresponding PSM-layout is phase-assignable.

Determining a Substantially Minimal Set of Phase Conflicts in a PSM-Layout

Figure 4:
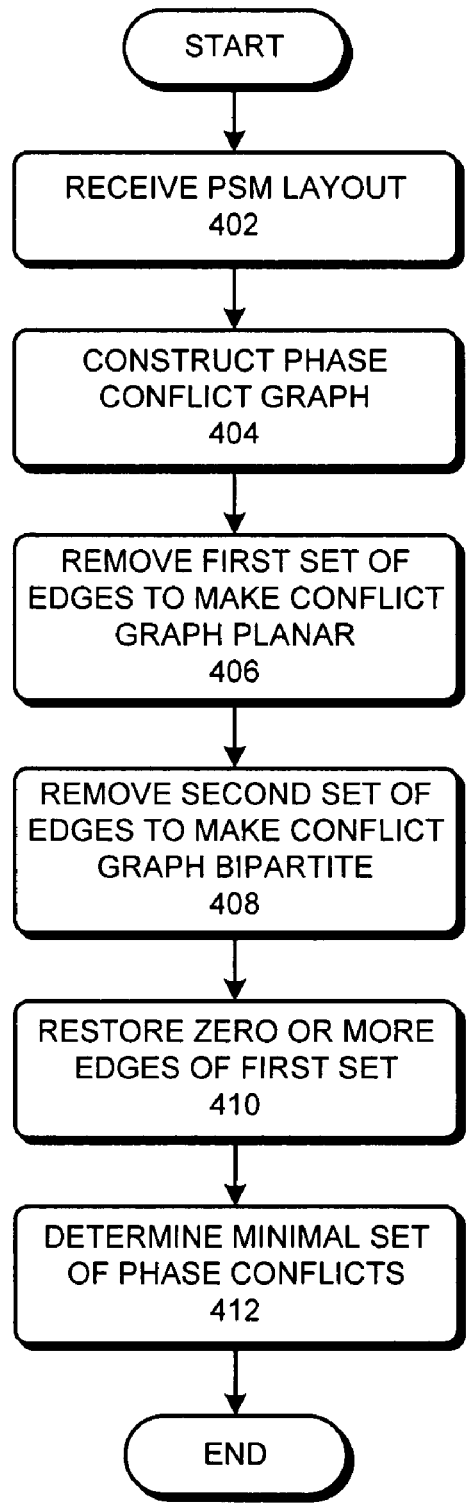
FIG. 4 presents a flowchart that illustrates the process for determining a substantially minimal set of phase conflicts in a PSM-layout in accordance with an embodiment of the present invention.

FIG. 4 presents a flowchart that illustrates the process for determining a substantially minimal set of phase conflicts in a PSM-layout in accordance with an embodiment of the present invention. A set S of phase conflicts is minimal if there exists no proper subset of S which when corrected will make the PSM-layout phase-assignable.

The process typically starts by receiving a PSM-layout (step 402). Note that, in one embodiment of the present invention, instead of receiving a PSM-layout, the system can generate a PSM-layout based on the locations of the features.

Next, the system constructs a phase conflict graph from the PSM-layout (step 404). Note that a phase conflict graph can be constructed using a number of techniques.

Figure 5A:
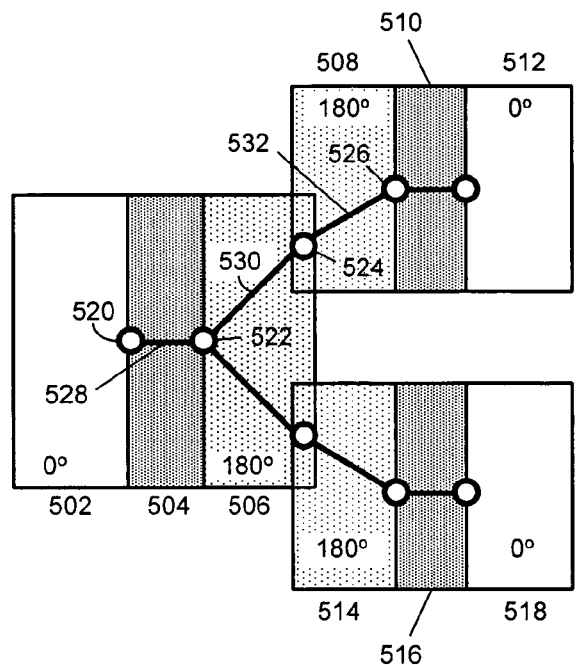
FIG. 5A illustrates how a phase conflict graph can be constructed from the PSM-layout in accordance with an embodiment of the present invention.

For example, FIG. 5A illustrates how a phase conflict graph can be constructed from the PSM-layout in accordance with an embodiment of the present invention.

Feature 504 is flanked by adjacent shifters 502 and 506, feature 510 is flanked by adjacent shifters 508 and 512 and feature 516 is flanked by adjacent shifters 514 and 518.

A phase conflict graph can be constructed by first creating a node for each shifter in the PSM-layout. For example, node 520 corresponds to shifter 502, node 522 corresponds to shifter 506, and node 526 corresponds to shifter 508. (Note that, for the sake of clarity, we have not labeled the nodes that correspond to shifters 512, 514, and 518.)

Next the system can create conflict-edges between pairs of nodes that correspond to adjacent shifters that need to have different (e.g., opposite) phase shifts. For example, conflict edge 528 can be created between nodes 520 and 522, which correspond to adjacent shifters 502 and 506 that need to have different phase shifts. (Note that, for the sake of clarity, we have not labeled the conflict edges that correspond to adjacent shifters 508-and-512, and 514-and-518.)

The system can then create an edge between pairs of nodes that correspond to overlapping shifters that need to have the same phase shift. Next, the system can create an overlap-node that subdivides the edge into two overlap-edges: a first overlap-edge between one of the nodes of the edge and the overlap-node; and a second overlap-edge between the overlap-node and the other node of the edge. For example, overlap-node 524 subdivides the edge between node 522 and node 526 into two overlap-edges: 530 and 532. (Note that, for the sake of clarity, we have not labeled the overlap-edges that correspond to the overlapping shifters 506 and 514.)

Figure 5B:
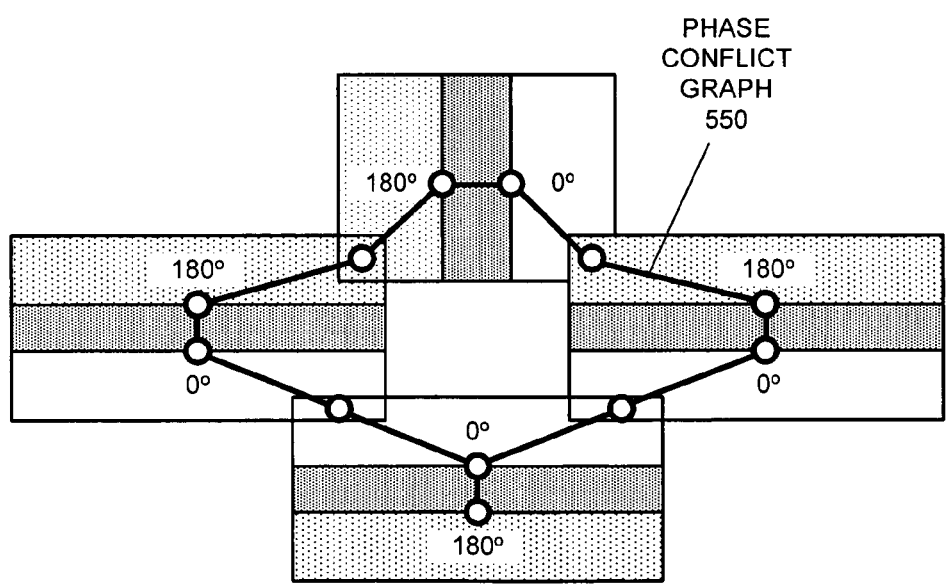
FIG. 5B illustrates a phase conflict graph in accordance with an embodiment of the present invention.

FIG. 5B illustrates a phase conflict graph in accordance with an embodiment of the present invention. Phase conflict graph 550, which contains 12 nodes and 12 edges, is created based on the layout shown in FIG. 5B. Note that phase conflict graph 550 contains an odd cycle (11 node cycle), which can indicate a phase conflict. Furthermore, note that, a graph is bipartite if and only if it does not contain any odd cycles.

Furthermore, in one embodiment the system assigns weights to the edges in the phase-conflict graph. Specifically, the system can assign weight $a \cdot W + b \cdot (1/F)$ to an overlap-edge, where W is the minimum amount of space that needs to be added between the pair of overlapping shifters associated with the overlap-edge so that they can have different phase shifts, F is the number of phase conflicts that are corrected when space is added between the pair of overlapping shifters, and a, b are weighting factors. In another embodiment, the system can assign a constant weight (e.g., 1) to all the edges. In yet another embodiment, the system can assign weight W to an overlap-edge, where W is the minimum amount of space that needs to be added between the pair of overlapping shifters associated with the overlap-edge so that they can have different phase shifts.

Once the system creates the phase conflict graph G, the system then removes a first set of edges E1 from the phase-conflict graph to build a planar sub-graph $G_1$ (step 406). Note that the first set of edges can be an empty set if the constructed phase-conflict graph is already planar.

Next, the system removes a second set of edges $E_2$ from the planar sub-graph $G_1$ to make the graph bipartite (step 408). Let $G_2$ denote the graph that is derived from $G_1$ after removing the edges $E_2$ from $G_1$. Note that the second set of edges $E_2$ can be an empty set if the graph $G_1$ is already bipartite.

Note that graph bipartization (i.e. finding a minimum-weight set of edges which when removed will make a graph bipartite) is an NP-hard for general graphs. However, a process for finding the optimal solution for graph bipartization exists if the input graph is planar. This is why the system first makes the graph planar by removing the first set of edges. The planarization process allows the system to use an optimal technique to make the graph bipartite.

In one embodiment, the system tries to remove edges that have lower weights before removing edges that have higher weights. Furthermore, in one embodiment, the system assigns a substantially higher weight to a conflict-edge than the weight assigned to an overlap-edge. In this way, the system can ensure that the first set of edges and the second set of edges primarily contain overlap-edges.

Continuing with the process illustrated in FIG. 4, the system then restores zero or more edges of the first set of edges $E_1$ to $G_2$, such that none of the restored edges creates an odd cycle in the graph $G_2$, which is a sub-graph of the phase-conflict graph G (step 410). Recall that an odd cycle in the phase-conflict graph can indicate a phase conflict.

In one embodiment of the present invention, the weight of an edge corresponds to the cost of correcting the associated phase conflict. In this embodiment, the system can restore higher weighted edges before restoring lower weighted edges. Note that, doing this can reduce the total cost of correcting the identified phase conflicts.

Next, the system determines a substantially minimal set of phase conflicts using the second set of edges and the unrestored edges of the first set of edges (step 412).

Note that, first making the phase-conflict graph planar and then making it bipartite allows the method to determine a substantially minimal set of phase conflicts, which reduces the number of corrections required to make the PSM-layout phase-assignable.

Process of Correcting a Set of Phase Conflicts in a Layout

Once the phase conflicts are identified, they can be corrected using essentially three methods. In the first method, the shapes of the shifters are slightly modified to correct the phase conflict (e.g., by introducing 45° cuts at the corners of the shifters). Note that this method does not require changes to the layout. Unfortunately, making such small modifications to the shifter shape can significantly complicate mask creation (especially as the number of phase conflicts is increasing with each decreasing technology node), and thereby increase the cost of mask creation. In addition, some phase conflicts cannot be reliably solved using these cuts.

The second method increases the size of a feature associated with the phase conflict. Note that phase shifters are typically used when a feature is so small that it cannot print properly without using phase shifters. Hence, increasing the size of a feature associated with a phase conflict obviates the need for using shifters, thereby correcting the phase conflict. Unfortunately, increasing the size of a feature can substantially change the behavior of the integrated circuit, which can lead to timing and signal integrity problems.

In the third method, a space is added between two overlapping shifters that have a phase conflict. This moves the overlapping shifters away from one another, which allows them to have different phase shifts, thereby correcting the phase conflict. Note that adding space between two overlapping shifters is unlikely to substantially change the behavior of the integrated circuit. That is why this method may be preferred over the previous method, which increases the size of the feature to correct the phase conflict.

Figure 6:
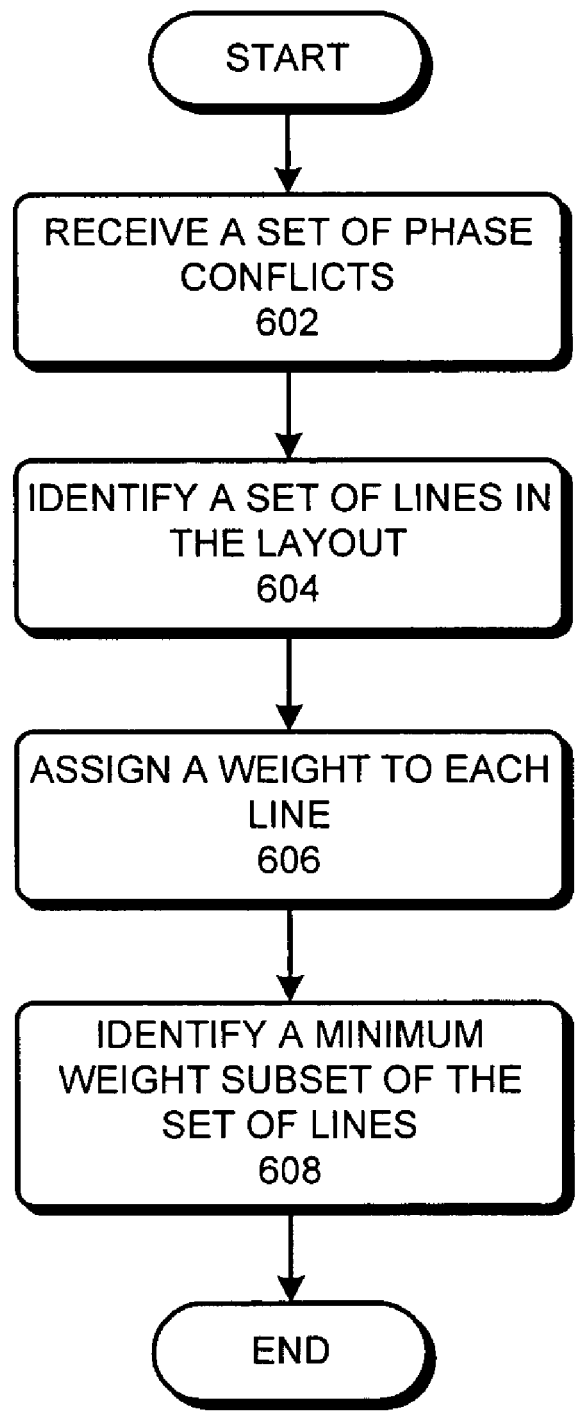
FIG. 6 presents a flowchart that illustrates a process for correcting a set of phase conflicts in a layout in accordance with an embodiment of the present invention.

FIG. 6 presents a flowchart that illustrates a process for correcting a set of phase conflicts in a layout in accordance with an embodiment of the present invention.

The process usually begins by receiving a set of phase conflicts (step 602). Note that these phase conflicts involves overlapping shifters that need to have different phase shifts.

Next, the system identifies a set of lines in the layout, such that adding space along a line in the set of lines corrects one or more phase conflicts (step 604). Specifically, adding space along a line can move the overlapping shifters away from one another, which allows them to have different phase shifts, thereby correcting the set of phase conflicts. The set of lines L is deemed minimal if there does not exist a proper subset of L that can be used to add space and correct all of the selected phase conflicts.

Note that changing the relative position of features (and the associated shifters) in a layout can introduce DRC errors. That is why an embodiment of the present invention adds space along the entire line instead of simply moving pairs of feature (and the associated shifters) independent of other features. Adding space along a set of lines helps to maintain the relative positions of the features (and the associated shifters).

Figure 7:
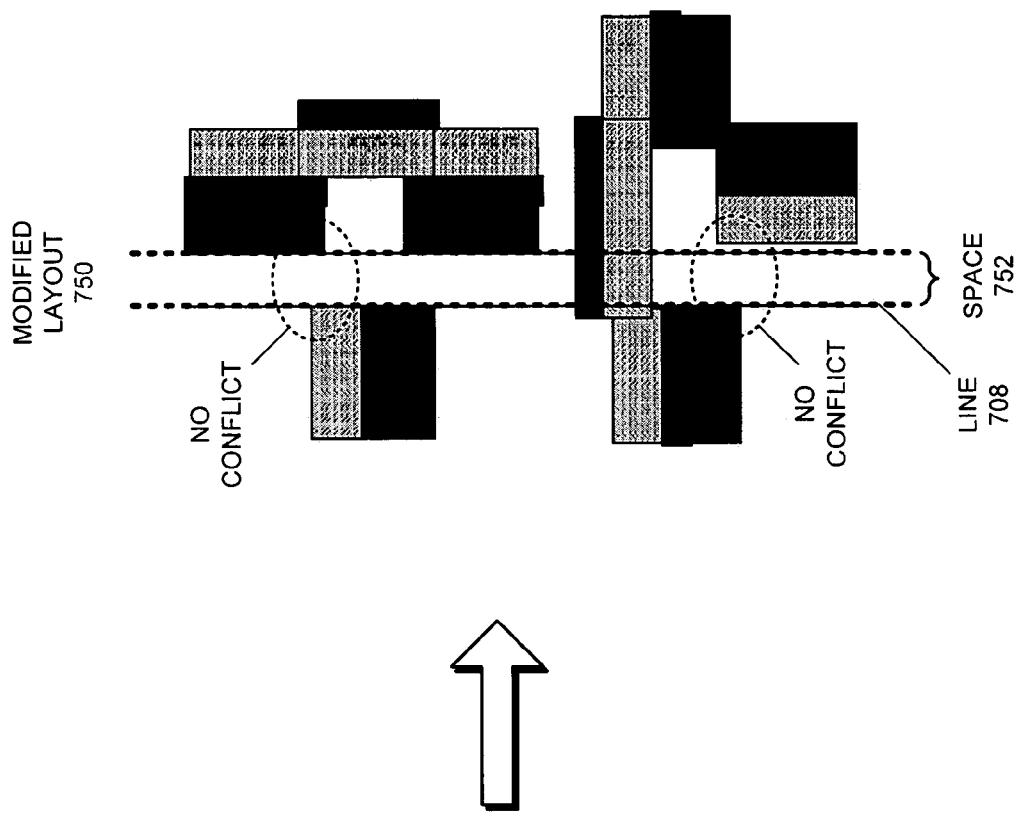
FIG. 7 illustrates how space can be added along a line to correct a phase conflict in accordance with an embodiment of the present invention.
Figure 7:
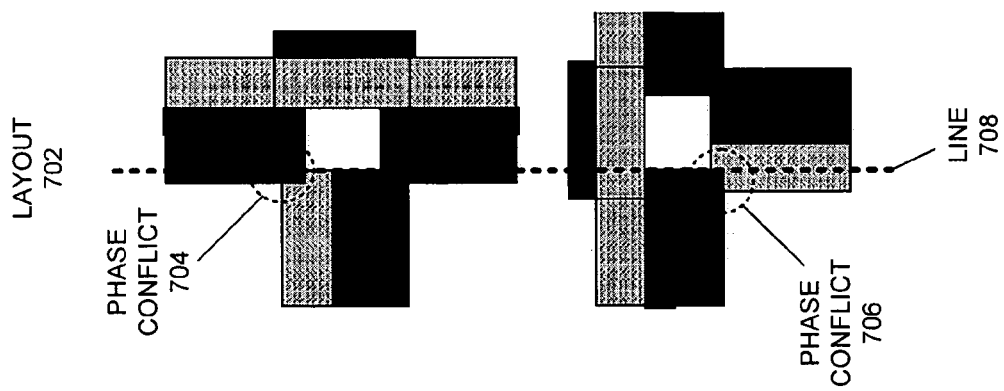

FIG. 7 illustrates how space can be added along a line to correct a phase conflict in accordance with an embodiment of the present invention.

Layout 702 contains phase conflicts 704 and 706. Note that adding space along line 708 can move the conflicting shifters away from one another, thereby correcting the phase conflict. For example, space 752 can be added along line 708 to generate modified layout 750, which does not have phase conflicts.

Continuing with the process illustrated in FIG. 6, the system then assigns a weight to each line in the set of lines, which indicates the cost of adding space along the line (step 606). The cost could be an area and/or timing cost. Note that, in one embodiment, the system can assign a weight to each line, which is proportional to the minimum amount of space that needs to be added along that line to correct one or more phase conflicts. For example, the system can assign a weight to line 708, which is proportional to the amount (or width) of space 752.

Next, the system identifies a minimum-weight subset of the set of lines, such that adding space along the lines in the subset corrects the set of phase conflicts (step 608).

Note that the system can use a number of techniques to identify a minimum-weight subset of the set of lines. For example, in one embodiment of the present invention, the system can identify a minimum-weight subset by solving an associated weighted set covering problem.

Figure 8:
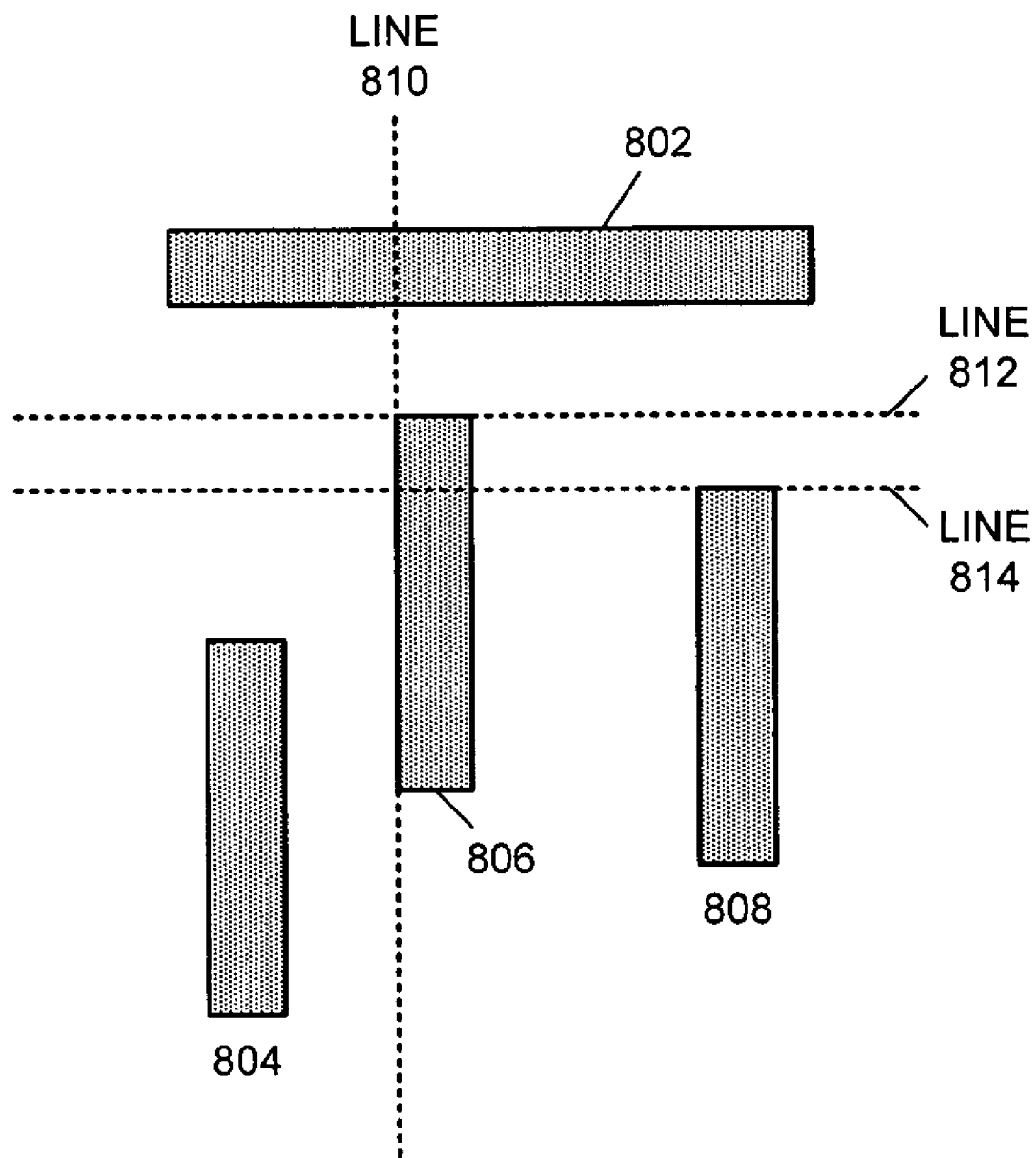
FIG. 8 illustrates how a minimum-weight subset of a set of lines can be found by solving an associated weighted set covering problem in accordance with an embodiment of the present invention.

FIG. 8 illustrates how a minimum-weight subset of a set of lines can be found by solving an associated weighted set covering problem in accordance with an embodiment of the present invention.

The layout shown in FIG. 8 contains features 802, 804, 806, and 808. Note that, for the sake of clarity, we do not show the phase shifters associated with these features.

There are three phase conflicts in the layout (not shown for the sake of clarity). The first phase conflict (henceforth called "conflict 1") is between the phase shifters for features 802 and 806. The second phase conflict (henceforth called "conflict 2") is between the phase shifters for features 802 and 808. The third phase conflict (henceforth called "conflict 3") is between the phase shifters for features 804 and 806.

Note that adding space along lines 810, 812, and 814 can correct one or more phase conflicts. For example, adding space along line 812 can correct both conflict 1 and conflict 2, whereas adding space along line 814 can only correct conflict 2. Similarly, adding space along line 816 can only correct conflict 3.

Furthermore, note that adding space along a line helps maintain the relative positions of features in the layout. For example, if we move features 806 and 808 independently of one another, it can change three relative positions: 802 and 806, 802 and 808, 806 and 808. On the other hand, if we add space along line 812, it moves features 806 and 808 in tandem, which maintains their relative positions with respect to one another. Maintaining the relative positions of features is necessary to prevent the introduction of DRC errors in the layout, thereby preventing the need for DRC correction. This is desirable since the additional DRC correction step can again introduce additional phase conflicts. Thus, the correction system prevents expensive iterations between DRC correction and phase conflict correction.

The association between a line and the conflicts that can be corrected by adding space along the line can be represented using set notation. For example, line 810 can be associated with the singleton set {3}, line 812 can be associated with set {1, 2}, and line 814 can be associated with singleton set {2}. Note that the elements of a set indicate the phase conflicts that can be corrected by adding space along the associated line.

Moreover, each line can be assigned a weight that corresponds to the cost of correcting the associated phase conflicts. Specifically, the assigned weight can be proportional to the amount (or width) of space that needs to be added along the line to correct the associated phase conflicts. For example, lines 810, 812, and 814, can be assigned weights 1, 2, and 1, respectively, which correspond to the amount of space that needs to be added along those lines to correct the associated phase conflicts.

Note that, the solution to the resulting weighted set covering problem can be used to determine a substantially minimal set of lines.

For example, a set cover can include sets associated with lines 810, 812, and 814, because between them they cover all the phase conflicts. Note that, based on the exemplary weight assignments described above, the weight of this set cover is 4 (1+2+1). Another set cover can include the sets associated with lines 810 and 812, but not include the set associated with line 814. Note that adding space along line 812 can correct phase conflicts 1 and 2, and adding space along line 810 can correct phase conflict 3, and hence, between them they cover all the phase conflicts. Furthermore, based on the exemplary weight assignments, the weight of this set cover is 3 (1+2), which is less than the weight of the previous set cover, and hence, may be preferred over the previous set cover. Note, however, that a solution that only includes lines 810 and 814 is not a correct solution (even though the weight of this set cover is only 2), since phase conflict 1 is not corrected by this solution.

To summarize, the solution of the weighted set covering problem can be used to determine a substantially minimal set of lines in the layout, such that adding space along the substantially minimal set of lines corrects the set of phase conflicts.

Additionally, note that, a number of variants of the weighted set covering problem can also be used to determine a substantially minimal set of lines in the layout. For example, in one variation on this embodiment, the system can use the weighted set covering problem to determine a substantially minimal set of lines with an added constraint that the layout area should not increase more than a specified amount.

CONCLUSION

The data structures and code described in the foregoing description are typically stored on a computer-readable storage medium, which may be any device or medium that can store code and/or data for use by a computer system. This includes, but is not limited to, magnetic and optical storage devices such as disk drives, magnetic tape, CDs (compact discs) and DVDs (digital versatile discs or digital video discs), and computer instruction signals embodied in a transmission medium (with or without a carrier wave upon which the signals are modulated). For example, the transmission medium may include a communications network, such as the Internet.

Furthermore, the foregoing descriptions of embodiments of the present invention have been presented only for purposes of illustration and description. They are not intended to be exhaustive or to limit the present invention to the forms disclosed. Accordingly, many modifications and variations will be readily apparent to practitioners skilled in the art.

For example, although we have described embodiments of the present invention in the context of a layout for an integrated circuit, these embodiments can be readily used to identify and correct phase conflicts for any mask or layout that is used in a semiconductor manufacturing process. In particular, embodiments of the present invention can be used to identify and correct phase conflicts in layouts that are used for manufacturing micro-electro-mechanical systems (MEMS).

Additionally, the above disclosure is not intended to limit the present invention. The scope of the present invention is defined by the appended claims.

What is claimed is:

1. A method for determining a set of phase conflicts in a PSM-layout, wherein correcting the set of phase conflicts makes the PSM-layout phase-assignable, the method comprising:

constructing a phase-conflict graph from a PSM-layout such that the PSM-layout is phase-assignable if and only if the phase-conflict graph is bipartite, by:

creating a node in the phase-conflict graph for a shifter in the PSM-layout, creating a conflict-edge between a first node and a second node, wherein the first node and the second node correspond to a pair of adjacent shifters that need to have different phase shifts, creating an edge between a third node and a fourth node, wherein the third node and the fourth node correspond to a pair of overlapping shifters that need to have the same phase shift, creating an overlap-node that subdivides the edge into two overlap-edges: a first overlap-edge between the third node and the overlap-node and a second overlap-edge between the overlap-node and the fourth node, and wherein an overlap-edge is assigned a weight a. W+b. (1/F), where W is the minimum amount of space that needs to be added between the pair of overlapping shifters associated with the overlap-edge so that they can have different phase shifts, F is the number of phase conflicts that are corrected when space is added between the pair of overlapping shifters, and a, b are weighting factors;

removing a first set of edges from the phase-conflict graph to create a planar sub-graph;

removing a second set of edges from the planar sub-graph to create a bipartite sub-graph, wherein each edge in the second set of edges is associated with the phase-conflict graph in the PSM-layout;

adding zero or more edges of the first set of edges to the bipartite sub-graph, such that none of the added edges creates an odd cycle in the bipartite sub-graph; and determining a set of phase conflicts in the PSM-layout associated with the remaining edges in the first set of edges and the second set of edges;

wherein first making the phase-conflict graph planar and then making it bipartite allows the method to determine a substantially minimal set of phase conflicts, which reduces the number of corrections required to make the PSM-layout phase-assignable.

2. The method of claim 1, wherein a conflict-edge is assigned a substantially higher weight than an overlap-edge, thereby ensuring that the first set of edges and the second set of edges primarily contain overlap-edges;

wherein removing the second set of edges from the planar sub-graph involves identifying a minimum-weight set of edges that when removed makes the planar sub-graph bipartite; and wherein adding zero or more edges of the first set of edges involves restoring higher weighted edges before restoring lower weighted edges.

3. The method of claim 1, wherein the phase shift of a shifter in the PSM-layout can be 0°, 90°, 180°, 270°, or any other combination of phase shifts that offsets the phase shifts of adjacent shifters by 180°.

4. A computer-readable storage medium storing instructions that when executed by a computer cause the computer to perform a method for determining a set of phase conflicts in a PSM-layout, wherein correcting the set of phase conflicts makes the PSM-layout phase-assignable, the method comprising:

constructing a phase-conflict graph from a PSM-layout such that the PSM-layout is phase-assignable if and only if the phase-conflict graph is bipartite creating a node in the phase-conflict graph for a shifter in the PSM-layout, creating a conflict-edge between a first node and a second node, wherein the first node and the second node correspond to a pair of adjacent shifters that need to have different phase shifts, creating an edge between a third node and a fourth node, wherein the third node and the fourth node correspond to a pair of overlapping shifters that need to have the same phase shift, creating an overlap-node that subdivides the edge into two overlap-edges: a first overlap-edge between the third node and the overlap-node and a second overlap-edge between the overlap-node and the fourth node, and wherein an overlap-edge is assigned a weight a. W+b. (1/F), where W is the minimum amount of space that needs to be added between the pair of overlapping shifters associated with the overlap-edge so that they can have different phase shifts, F is the number of phase conflicts that are corrected when space is added between the pair of overlapping shifters, and a, b are weighting factors;

removing a first set of edges from the phase-conflict graph to create a planar sub-graph;

removing a second set of edges from the planar sub-graph to create a bipartite sub-graph, wherein each edge in the second set of edges is associated with the phase-conflict graph in the PSM-layout;

adding zero or more edges of the first set of edges to the bipartite sub-graph, such that none of the added edges creates an odd cycle in the bipartite sub-graph; and determining a set of phase conflicts in the PSM-layout associated with the remaining edges in the first set of edges and the second set of edges;

wherein first making the phase-conflict graph planar and then making it bipartite allows the method to determine a substantially minimal set of phase conflicts, which reduces the number of corrections required to make the PSM-layout phase-assignable.

5. The computer-readable storage medium of claim 3, wherein a conflict-edge is assigned a substantially higher weight than an overlap-edge, thereby ensuring that the first set of edges and the second set of edges primarily contain overlap-edges;

wherein removing the second set of edges from the planar sub-graph involves identifying a minimum-weight set of edges that when removed makes the planar sub-graph bipartite; and wherein adding zero or more edges of the first set of edges involves restoring higher weighted edges before restoring lower weighted edges.

6. The computer-readable storage medium of claim 4, wherein the phase shift of a shifter in the PSM-layout can be 0°, 90°, 180°, 270°, or any other combination of phase shifts that offsets the phase shifts of adjacent shifters by 180°.

7. A method for determining a set of phase conflicts in a PSM-mask, wherein correcting the set of phase conflicts makes the PSM-mask phase-assignable, the method comprising:

constructing a phase-conflict graph from a PSM-mask such that the PSM-mask is phase-assignable if and only if the phase-conflict graph is bipartite creating a node in the phase-conflict graph for a shifter in the PSM-layout, creating a conflict-edge between a first node and a second node, wherein the first node and the second node correspond to a pair of adjacent shifters that need to have different phase shifts, creating an edge between a third node and a fourth node, wherein the third node and the fourth node correspond to a pair of overlapping shifters that need to have the same phase shift, creating an overlap-node that subdivides the edge into two overlap-edges: a first overlap-edge between the third node and the overlap-node and a second overlap-edge between the overlap-node and the fourth node, and wherein an overlap-edge is assigned a weight a. W+b. (1/F), where W is the minimum amount of space that needs to be added between the pair of overlapping shifters associated with the overlap-edge so that they can have different phase shifts, F is the number of phase conflicts that are corrected when space is added between the pair of overlapping shifters, and a, b are weighting factors;

removing a first set of edges from the phase-conflict graph to create a planar sub-graph;

removing a second set of edges from the planar sub-graph to create a bipartite sub-graph, wherein each edge in the second set of edges is associated with the phase-conflict graph in the PSM-mask;

adding zero or more edges of the first set of edges to the bipartite sub-graph, such that none of the added edges creates an odd cycle in the bipartite sub-graph; and determining a set of phase conflicts in the PSM-mask associated with the remaining edges in the first set of edges and the second set of edges;

wherein first making the phase-conflict graph planar and then making it bipartite allows the method to determine a substantially minimal set of phase conflicts, which reduces the number of corrections required to make the PSM-mask phase-assignable.

* * * * *

UNITED STATES PATENT AND TRADEMARK OFFICE
CERTIFICATE OF CORRECTION

PATENT NO. : 7,496,883 B2
APPLICATION NO. : 11/127694
DATED : February 24, 2009
INVENTOR(S) : Subarnarekha Sinha et al.

It is certified that error appears in the above-identified patent and that said Letters Patent is hereby corrected as shown below:

In claim 4 (at column 12, line 20), please insert the word --, by:-- so that the line reads: "if the phase-conflict graph is bipartite, by:".

In claim 5 (at column 12, line 59), please replace the number "3" with the number --4--.

Signed and Sealed this

Eighth Day of December, 2009

David J. Kappos
*Director of the United States Patent and Trademark Office*